(12) United States Patent
Okita

(10) Patent No.: US 8,487,409 B2
(45) Date of Patent: Jul. 16, 2013

(54) INDIUM PHOSPHIDE SUBSTRATE MANUFACTURING METHOD, EPITAXIAL WAFER MANUFACTURING METHOD INDIUM PHOSPHIDE SUBSTRATE, AND EPITAXIAL WAFER

(75) Inventor: Kyoko Okita, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 28 days.

(21) Appl. No.: 13/125,048

(22) PCT Filed: Jan. 12, 2010

(86) PCT No.: PCT/JP2010/050193
§ 371 (c)(1),
(2), (4) Date: Apr. 20, 2011

(87) PCT Pub. No.: WO2010/122821
PCT Pub. Date: Oct. 28, 2010

(65) Prior Publication Data
US 2011/0193196 A1    Aug. 11, 2011

(30) Foreign Application Priority Data

Apr. 20, 2009  (JP) ................................ 2009-102018

(51) Int. Cl.
*H01L 29/20* (2006.01)
(52) U.S. Cl.
USPC .................................. 257/615; 257/E29.089
(58) Field of Classification Search
USPC  257/467, E31.131, 615, E29.089; 250/338.1, 250/338.4; 134/28; 438/906
See application file for complete search history.

(56) References Cited

U.S. PATENT DOCUMENTS

| 6,200,885 | B1 * | 3/2001 | Wang et al. | 438/572 |
| 7,432,186 | B2 * | 10/2008 | Nishiura et al. | 438/604 |

FOREIGN PATENT DOCUMENTS

| CN | 1885499 A | 12/2006 |
| JP | S54-013500 A | 1/1979 |
| JP | S62-252140 A | * 11/1987 |
| JP | H05-166785 A | 7/1993 |
| JP | H05-182910 A | 7/1993 |
| JP | H05-267185 A | 10/1993 |
| JP | H10-242087 A | 9/1998 |
| JP | 2004-311726 A | 11/2004 |
| JP | 2008-244434 A | 10/2008 |

OTHER PUBLICATIONS

A. S. Barriere et al., "Study of a Chemical Cleaning of InP(100) Substrates by Infrared Absorption and Nuclear Reaction Analysis," Applied Surface Science, Mar. 1, 1993, vol. 64, pp. 225-230, Elsevier, NL.

(Continued)

Primary Examiner — Colleen Matthews
(74) Attorney, Agent, or Firm — James W. Judge (57) ABSTRACT

Affords methods of manufacturing InP substrates, methods of manufacturing epitaxial wafers, InP substrates, and eptiaxial wafers whereby deterioration of the electrical characteristics can be kept under control, and at the same time, deterioration of the PL characteristics can be kept under control. An InP substrate manufacturing method of the present invention is provided with the following steps. An InP substrate is prepared (Steps S1 through S3). The InP substrate is washed with sulfuric acid/hydrogen peroxide (Step S5). After the step of washing with sulfuric acid/hydrogen peroxide (Step S5), the InP substrate is washed with phosphoric acid (Step S6).

4 Claims, 6 Drawing Sheets

OTHER PUBLICATIONS

Gar B. Hoflund et al., "A Characterizaton Study of the Native Oxide Layer Formed on Chemically Etched InP(111)," Surface and Interface Analysis, 1986, vol. 9, pp. 319-323, John Wiley & Sons Ltd., NJ.

Stuart J. Hoekje et al., "Surface Characterizaton Study of InP(100) Substrates Using Ion-Scattering Spectroscopy, Auger Electron Spectroscopy and Electron Spectroscopy for Chemical Analysis I: Comparison of Substrate-Cleaning Techniques," Thin Solid Films, 1991, vol. 197, pp. 367-380, Elsevier, NL.

Stuart J. Hoekje et al., "Surface Characterization Study of InP(100) Substrates Using ISS, AES and ESCA: Comparison of Substrates from Two Different Commercial Sources," Applied Surface Science, 1991, vol. 47, pp. 43-48, Elsevier, NL.

Stuart J. Hoekje et al., "Surface Characterization Study of InP(100) Substrates Using ISS, AES and ESCA. 3. Experimental Artifacts," Chem. Mater., 1991, vol. 3, pp. 77-81, American Chemical Society, Washington, DC.

Yun Sun et al., "Optimized Cleaning Method for Producing Device Quality InP(100) Surfaces," Journal of Applied Physics, 2005, vol. 97, pp. 124902-01 to 124902-07, American Institute of Physics, NY.

Y. Tao et al., "S-Passivated InP(100)—(1X1) Surface Prepared by a Wet Chemical Process," Appl. Phys. Lett., May 25, 1992, vol. 60, No. 21, pp. 2669-2671, American Institute of Physics, NY.

Yong Jin Chun et al., "Low Temperature Surface Cleaning of InP by Irradiation of Atomic Hydrogen," Japanese Journal of Applied Physics, Feb. 15, 1993, pp. L287-L289, vol. 32, No. 2B, The Japan Society of Applied Physics, Japan.

S. Singh et al., "Analysis of InP Surface Prepared by Various Cleaning Methods," Journal of The Electrochemical Society, 1982, pp. 447-448, vol. 129, Issue 2, The Electrochemical Society, Pennington, NJ.

* cited by examiner

INDIUM PHOSPHIDE SUBSTRATE MANUFACTURING METHOD, EPITAXIAL WAFER MANUFACTURING METHOD INDIUM PHOSPHIDE SUBSTRATE, AND EPITAXIAL WAFER

TECHNICAL FIELD

The present invention relates to methods of manufacturing indium phosphide substrates, to methods of manufacturing epitaxial wafers, to indium phosphide substrates, and to epitaxial wafers.

BACKGROUND ART

Indium phosphide (InP) substrates, on account of features including that they possess light-emitting characteristics and that they have a high electron drift velocity, are widely employed in components including semiconductor lasers, LEDs (light-emitting diodes), and high-speed microelectronic devices. With semiconductor lasers and LEDs, by measuring the PL intensity after the epitaxial layers have been formed onto the InP substrate, an assessment of the light-emitting performance can be simply and readily made.

The PL light-emitting intensity should be strong. And with high-speed devices, since impurities at the interface between the InP substrate and the epitaxial layers lead to leakage problems, the characteristics stabilize the fewer are n-type or p-type impurities at the interface.

An example of a method of manufacturing InP substrates is disclosed in Japanese Unexamined Pat. App. Pub. No. H05-267185 (Patent Reference 1). Specifically, an ingot is cut into wafers and then the wafers are polished to a specular finish. The front side of the optically flat wafers, having chemical components of the polishing agents remaining on it, becoming oxidized after the polishing, or having organic matter clinging to it, will have formed thereon a layer (front-side film) that differs from the ingot. Etching removal of the front-side film, employing sulfuric acid, is carried out to leave the thickness of the front-side film not greater than 1 nm.

Examples, furthermore, of InP substrate front-side treatments employing solutions other than sulfuric acid are disclosed in Japanese Unexamined Pat. App. Pub. No. H05-166785 (Patent Reference 2), Japanese Unexamined Pat. App. Pub. No. S54-13500 (Patent Reference 3) and Japanese Unexamined Pat. App. Pub. No. S62-252140 (Patent Reference 4). Patent Reference 2 discloses washing InP wafers in a substance blend of phosphoric acid-hydrogen peroxide-water, or in a liquid blend of hydrogen fluoride-hydrogen peroxide-water. Patent Reference 3 discloses etching InP single-crystal wafers with sulfuric acid in which the hydrogen peroxide is at or under 15 by volume. Patent Reference 4 discloses washing InP wafers by means a solution blend of phosphoric acid-hydrogen peroxide-water, or a solution blend of hydrogen fluoride-hydrogen peroxide-water.

CITATION LIST

Patent Literature

Patent Reference 1: Japanese Unexamined Pat. App. Pub. No. H05-267185
Patent Reference 2: Japanese Unexamined Pat. App. Pub. No. H05-166785
Patent Reference 3: Japanese Unexamined Pat. App. Pub. No. S54-13500
Patent Reference 4: Japanese Unexamined Pat. App. Pub. No. S62-252140

SUMMARY OF INVENTION

Technical Problem

In above-cited Patent Reference 1, sulfuric acid is employed in order to clear away the front-side film. Consequently, sulfur (S) is left remaining on the front side by the etching process employing sulfuric acid. A problem with S being residual on the front side is that when epitaxial layers are formed onto that surface, the electrical characteristics are deteriorated.

In above-cited Patent References 2 through 4, InP substrates are washed with solutions containing hydrogen peroxide.

The present inventors discovered, as a result of dedicated research efforts, that when solutions containing hydrogen peroxide are employed to wash an InP substrate, silicon (Si) clinging to the front side may not be sufficiently reduced. They discovered that a problem with Si and other impurities clinging to the front side of an InP substrate is that when epitaxial layers are formed atop the substrate, the electrical characteristics deteriorate.

They further discovered that a problem with organic matter being residual within the front-side film is that when epitaxial layers are formed atop the substrate, bonding between carbon (C) and oxygen (O), and residual In oxides from temperature ramp-up during epitaxy deteriorate the PL characteristics.

The present invention was brought about in order to resolve issues of the kind discussed above, and an object of the present invention is to make available methods of manufacturing InP substrates, methods of manufacturing epitaxial wafers, InP substrates, and epitaxial wafers whereby deterioration of the electrical characteristics can be kept under control, and at the same time, deterioration of the PL characteristics can be kept under control.

Solution to Problem

An InP substrate manufacturing method of the present invention is provided with the following steps.

An InP substrate is prepared.

The InP substrate is washed with sulfuric acid/hydrogen peroxide.

After the step of washing with sulfuric acid/hydrogen peroxide, the InP substrate is washed with phosphoric acid.

On the prepared InP substrate, an organic film from bonding of C and oxygen (O), and an oxide film from bonding of In, P and O will have formed. In accordance with an InP substrate manufacturing method of the present invention, washing with sulfuric acid/hydrogen peroxide, which contains strongly acidic sulfuric acid, makes it possible to control the organic film and oxide film from remaining Deterioration of PL characteristics can therefore be kept under control. In that state then further washing with phosphoric acid makes it possible to control S and other impurities in the sulfuric acid/hydrogen peroxide from remaining Deterioration of the electrical characteristics can therefore be kept under control.

With an above-described method of manufacturing an InP substrate, in said step of washing with phosphoric acid, preferably an aqueous phosphoric acid solution of concentration that is between 1% and 30% both inclusive is utilized.

The present inventors, as a result of dedicated research efforts, discovered that haze (superficial micro-abrasions) on the front side of the InP substrate may be reduced by making the concentration of the aqueous phosphoric acid solution be between 1% and 30%, inclusive. Deterioration of the PL characteristics may therefore be kept under control, and at the same time, deterioration of the electrical characteristics may therefore be kept under control and further, haze on the front side may be reduced.

With an above-described method of manufacturing an InP substrate, in said preparation step an InP substrate containing a dopant consisting of at least one substance selected from the group composed of iron (Fe), sulfur (S), tin (Sn), and zinc (Zn) is prepared.

With the present invention, in an aforedescribed-dopant-containing InP substrate as well, deterioration of the PL characteristics can be kept under control and at the same time deterioration of the electrical characteristics can be kept under control.

An epitaxial wafer manufacturing method of the present invention is provided with a step of manufacturing an InP substrate according to an InP substrate manufacturing method of any of the foregoing descriptions, and a step of forming an epitaxial layer onto the InP substrate.

In accordance with an epitaxial wafer manufacturing method of the present invention, InP in which the remaining behind of organic films and oxide films may be kept under control and in which the remaining behind of impurities may be minimized is utilized. Therefore, epitaxial wafers in which deterioration of the PL characteristics can be kept under control and at the same time in which deterioration of the electrical characteristics can be kept under control can be manufactured.

An InP substrate of the present invention is an InP substrate having a front side, and is characterized in that along the front side, the concentration of sulfuric-acid ions ($SO_4^{2-}$) is not greater than 0.6 ng/cm$^2$, and the concentration of C and the concentration of O that has formed bonds with atoms other than S is 40 atomic percent or less.

In accordance with an InP substrate of the present invention, since the concentration of sulfuric-acid ions ($SO_4^{2-}$) on the front side is not greater than 0.6 ng/cm$^2$, the concentration of impurities is low. Therefore, when an epitaxial layer(s) is formed onto an InP substrate of the present invention, deterioration of the electrical characteristics can be kept under control. Further, the concentration of C and the concentration of O that has formed bonds with atoms other than S is 40 atomic percent or less. Since this keeps organic films and oxide films from being remnant on the front side, when an epitaxial layer(s) is formed onto an InP substrate of the present invention, deterioration of the PL characteristics can be kept under control.

With an aforedescribed InP substrate, preferably it is characterized in that along the front side the ratio of the In concentration to the P concentration (In/P) is 1.23 or less, and In oxides are 1.2 atomic percent or less.

When In/P is 1.23 or less, the front side is stabilized and bonding together with impurities may be kept under control. When the In oxides are 1.2 atomic percent or less, during temperature ramp-up in order to form epitaxial layers onto the InP substrate, In oxides will fly off more readily, facilitating the appearance of a cleansed front side. Thus, through the minimizing of front-side impurities, deterioration of the PL characteristics may be kept under control.

In the above-described InP, preferably a dopant consisting of at least one substance selected from the group composed of Fe, S, Sn and Zn is incorporated.

In the present invention, even with an InP substrate containing the above-described dopant, deterioration of the PL characteristics can be kept under control and at the same time deterioration of the electrical characteristics can be kept under control.

An epitaxial wafer of the present invention is furnished with an aforedescribed InP substrate, and an epitaxial layer formed onto the front side of the InP substrate.

In accordance with an epitaxial wafer of the present invention, an InP substrate in which the remaining behind of an organic film may be kept under control and in which the remaining behind of impurities may be kept under control is utilized. Therefore, an epitaxial wafer in which deterioration of the PL characteristics can be kept under control and at the same time deterioration of the electrical characteristics can be kept under control may be realized.

Advantageous Effects of Invention

In accordance with the foregoing, present-invention methods of manufacturing InP substrates, methods of manufacturing epitaxial wafers, InP substrates, and epitaxial wafers make it possible to keep deterioration of the electrical characteristics under control and at the same time to keep deterioration of the PL characteristics under control.

DESCRIPTION OF EMBODIMENTS

Below, a description of embodying modes and embodiment examples of the present invention will be made based on the drawings. It should be understood that in the following, identical or corresponding parts in the drawings are labeled with identical reference marks, and their description will not be repeated.

Embodying Mode 1

Figure 1:
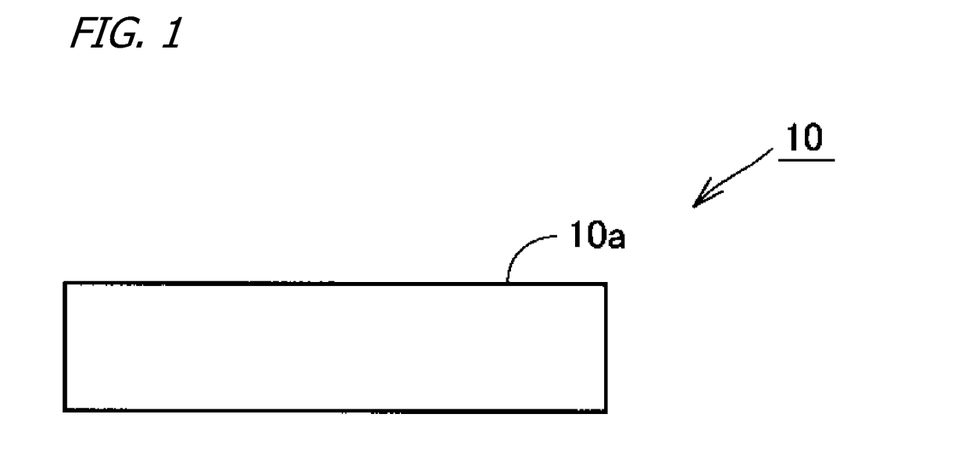
FIG. 1 is a side view representing, in simplified form, an InP substrate in Embodying Mode 1 of the present invention.

Referring to FIG. 1, an explanation of an InP substrate 10 in the present embodying mode will be made. As indicated in FIG. 1, the InP substrate 10 has a front side 10a.

Along the front side 10a, the concentration of $SO_4^{2-}$ is not greater than 0.6 ng/cm$^2$, preferably not greater than 0.05 ng/cm$^2$. Since S and O as impurities clinging to the front side 10a may be reduced with the concentration being not greater than 0.6 ng/cm$^2$, deterioration of the electrical characteristics may be kept under control when an epitaxial layer(s) has been formed onto the InP substrate 10. With the concentration being not greater than 0.05 ng/cm$^2$, deterioration of the electrical characteristics may be further minimized.

Along the front side 10a, the concentration of C and the concentration of O that has formed bonds with atoms other than S is 40 atomic percent or less; preferably it is 37.0 atomic percent or less. With the concentration being at or below 40 atomic percent, bonds between C and O, which are the organic film, and bonds between In, P and O, which are the oxide film, may be reduced, whereby deterioration of the PL characteristics may be kept under control when an epitaxial layer(s) has been formed onto the InP substrate 10. With the concentration being not greater than 37.0 atomic percent, deterioration of the PL characteristics may be further minimized.

Herein, the foregoing "concentration of C and the concentration of O that has formed bonds with atoms other than S" can be found by a formula expressed by: C concentration+O concentration−S concentration×4. Along the front side 10a, there will be instances in which O has formed bonds with C, In and P, and instances in which O has formed bonds with S. Among the O atoms present on the front side 10a, the concentration of O that has formed bonds with atoms other than S serves as an indicator of the remaining behind of an organic film and oxide film. That is, O that has formed bonds with S derives not from the remaining behind of an organic film and oxide film, but from the sulfuric acid, and is a causative factor in the deterioration of electrical characteristics. Accordingly, to have oxygen be an indicator of the remaining behind of an organic film, with the formula given above, the O concentration that is four times the S concentration is excluded in order to omit the O present along the front side 10a as $SO_4$.

Indium oxides along the front side 10a preferably are not more than 1.2 atomic percent, and more preferably are not more that 1.0 atomic percent. Indium oxides are difficult to eliminate in forming an epitaxial layer onto the InP substrate 10. Therefore, if In oxides may be reduced to not more than 1.2 atomic percent, deterioration of the PL characteristics can be kept under control. In implementations where it is at or below 1.0 atomic percent, deterioration of the PL characteristics can be further minimized.

The ratio of the In concentration to the P concentration (In/P) along the front side 10a preferably is 1.28 or less, and more preferably is 1.23 or less. With the ratio being 1.28 or less, P is present to a relatively great extent, whereby the surface stabilizes and the front-side properties prove to be favorable. The ratio being 1.23 or less lets the front-side properties be more satisfactory.

The aforesaid "concentration of $SO_4^{2-}$ on the front side 10a" is a measurement determined by ion chromatography. And the aforesaid "concentration of C and concentration of O that has formed bonds with atoms other than S, and In oxides" are measurements determined by x-ray photoelectron spectroscopy (XPS).

The InP substrate 10 may be constituted from InP, and may contain a dopant consisting of at least one substance selected from the group composed of Fe, S, Sn and Zn.

To continue: An explanation of a method in the present embodying mode of manufacturing an InP substrate 10 will be made.

Figure 2:
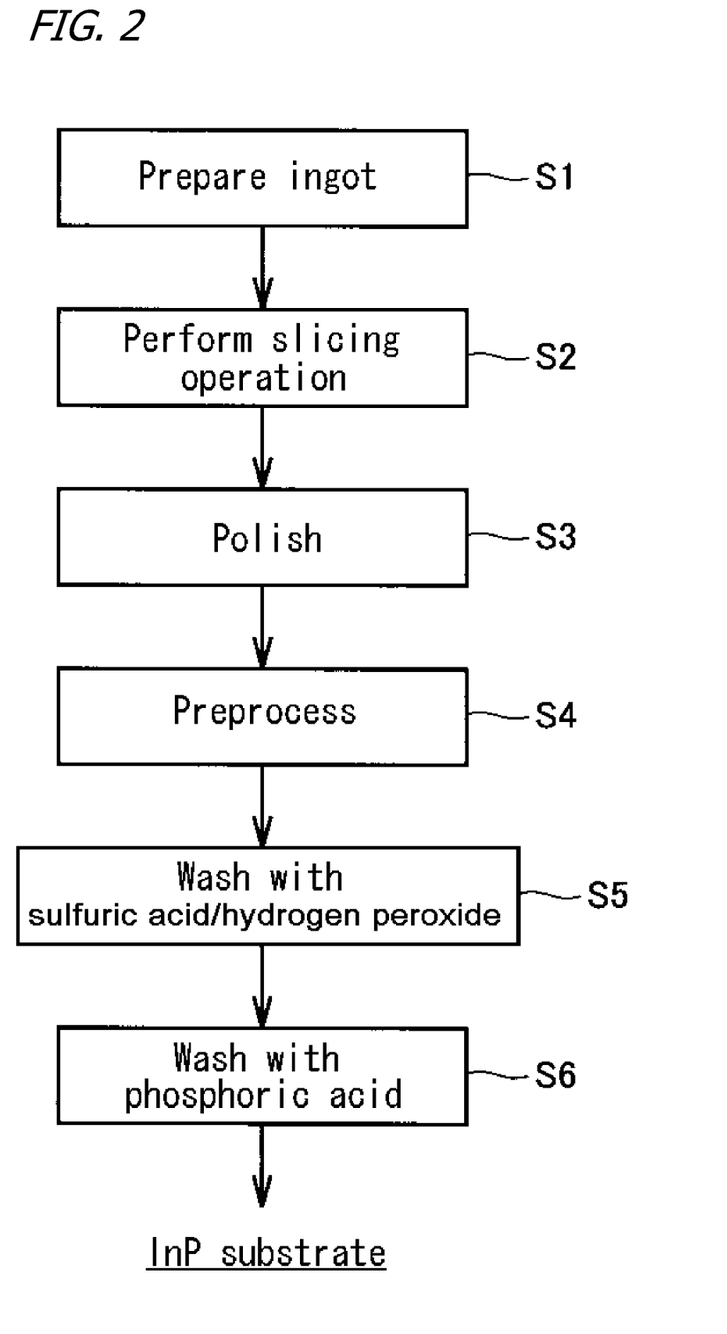
FIG. 2 is a flowchart setting forth a procedure for manufacturing an InP substrate in Embodying Mode 1 of the present invention.

To begin with, referring to FIG. 2, an InP ingot is prepared (Step S1). The ingot may be constituted from InP, and may contain a dopant consisting of at least one substance selected from the group composed of Fe, S, Sn and Zn.

Next, an operation of slicing an InP substrate (InP substrate 11 in FIG. 3) from the prepared ingot is carried out (Step S2). The way in which the slicing operation is done is not particularly limited. The InP substrate will bear a damage layer from the slicing operation.

The InP substrate from the slicing operation is then polished employing polishing agents, chemical polishing solutions, etc. (Step S3). The damage layer due to the slicing operation is thereby removed. These Step S1 through S3 enable the preparation of an InP substrate.

Next, the polished InP substrate is preprocessed (Step S4). The polishing agents, chemical polishing solutions, etc. are cleared away by the preprocessing.

Figure 3:
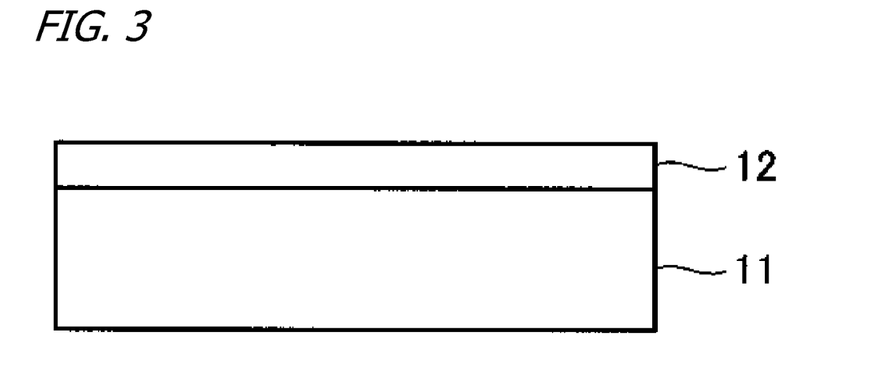
FIG. 3 is a side view representing, in simplified form, an InP substrate having undergone a slicing operation in Embodying Mode 1 of the present invention.

The preprocess washes in an alkaline solution followed by washing in hydrofluoric acid and further washing in an alkaline solution, for example. After any of Steps S2 through S4, as depicted in FIG. 3 an organic film and oxide film 12 will have formed on the front side of the InP substrate 11. It will be appreciated that the organic film contains C and O, and that the oxide film contains In, P and O.

Next the InP substrate 11 is washed in sulfuric acid/hydrogen peroxide (Step S5).

Sulfuric acid/hydrogen peroxide contains sulfuric acid and aqueous hydrogen peroxide (hydrogen peroxide). As the sulfuric acid/hydrogen peroxide, for example, a solution in which (sulfuric acid:hydrogen peroxide:water)=(10:1:1) to (5:1:1), etc. can be utilized.

Figure 4:
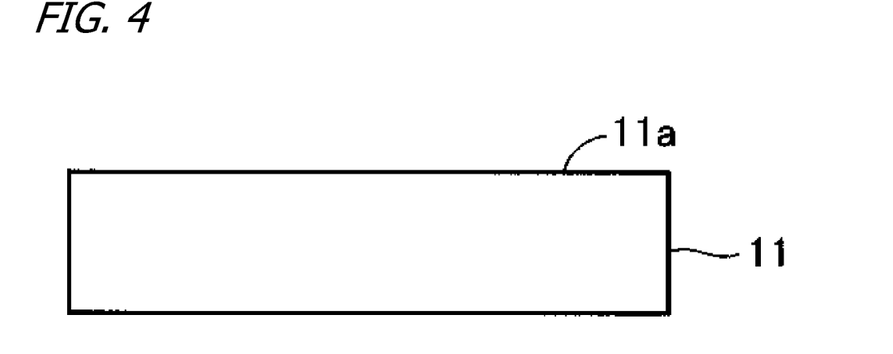
FIG. 4 is a side view representing, in simplified form, an InP substrate after having been washed with sulfuric acid/hydrogen peroxide in Embodying Mode 1 of the present invention.

Implementing Step S5 makes it possible to reduce, as indicated in FIG. 4, the organic film and oxide film 12 having formed on the front side of the InP substrate 11. Likewise, Si, etc. clinging to the front side of the InP substrate 11 can also be reduced. It will be appreciated that Si will be contained in the atmosphere, in the water employed in the washes, and in related media when the InP substrate 10 is manufactured, and thus will have clung to the front side of the InP substrate 11.

Next the InP substrate 11 is washed in phosphoric acid (Step S6). Implementing Step S6 makes it possible to reduce Si, $SO_4^{2-}$ (S and O) originating in the sulfuric acid, and other impurities clinging to the InP substrate 11. Further, even in cases where P originating in the phosphoric acid has remained behind on the InP substrate, when P is supplied to the front side 10a of the InP substrate 10, the surface becomes stabilized.

In Step S6 it is preferable that an aqueous phosphoric acid solution of concentration that is between 1 and 30, inclusive be utilized. Front-side haze can thereby be reduced.

Implementing the foregoing steps (Steps S1 through S6) makes it possible to manufacture the InP substrate represented in FIG. 1.

To continue: An explanation of the effects of a method in the present embodying mode of manufacturing an InP substrate 10 will be made. Following Step S4 of carrying out the preprocess, as represented in FIG. 3 an organic film and oxide film 12, and Si and other impurities will have adhered to the front side 11a.

Figure 5:
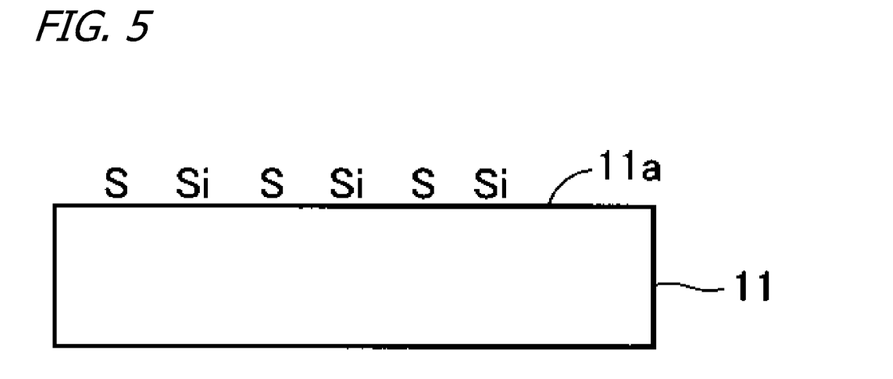
FIG. 5 is a schematic diagram for explaining the state of the front side of an InP substrate after having been washed with sulfuric acid/hydrogen peroxide in Embodying Mode 1 of the present invention.

With an InP substrate 10 manufacturing method in the present embodying mode, as indicated in FIG. 5, the adherence of the organic film and oxide film 12 and of Si will be reduced following Step S5 of the front side being washed with sulfuric acid/hydrogen peroxide, but the front side will have clinging to it S originating in the sulfuric acid/hydrogen peroxide. Nevertheless, by virtue of Step S6 of washing with phosphoric acid, the Si that could not be reduced by Step S5, as well as the S clinging due to Step S5 can be reduced. That is, the organic film and oxide film may be reduced, and S, Si and other impurities further may be reduced as well. If the organic film and oxide film may be reduced, then deterioration of the PL emission intensity (PL characteristics) may be kept under control. If the impurities may be reduced, then deterioration in the electrical characteristics may be kept under control. Accordingly, utilizing the InP substrate 10 in wireless communications applications and the like enables the characteristics to be improved.

Figure 6:
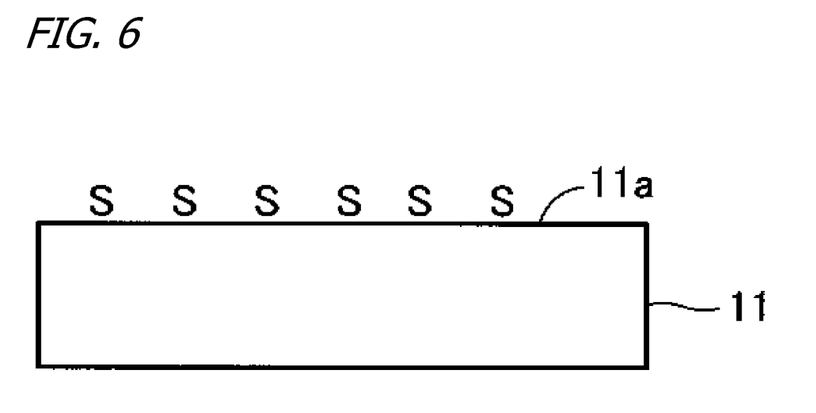
FIG. 6 is a schematic diagram for explaining the state of the front side of an InP substrate in a comparative example.

Next an explanation will be made of a comparative example in which, instead of as in Steps S5 and S6, the wash is performed with sulfuric acid as in Patent Reference 1. Since sulfuric acid is more strongly acidic than sulfuric acid/hydrogen peroxide, Si may be removed to a greater extent, as indicated in FIG. 6, than that following Step S5 of washing with sulfuric acid/hydrogen peroxide in the present embodying mode, but the S residue originating in sulfuric acid is greater. Consequently, with S as an impurity being the cause, the electrical characteristics will be harmed.

Figure 7:
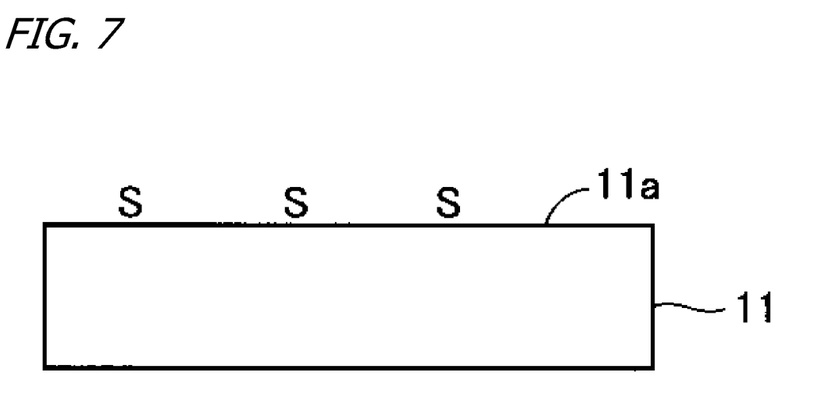
FIG. 7 is a schematic diagram for explaining the state of the front side of an InP substrate in a comparative example.

Furthermore, conceivable is a technique whereby after the substrate has been washed with sulfuric acid, it is washed with phosphoric acid. In that case, as indicated in FIG. 7 a portion of the S may be removed, but because the S remaining after the substrate has been washed with sulfuric acid is greater than when it has been washed, in the present embodying mode, with sulfuric acid/hydrogen peroxide, the S residue will be greater by comparison with the present embodying mode. Consequently, with S as an impurity being the cause, the electrical characteristics will be harmed.

In addition, the present inventors discovered as a result of dedicated research efforts that if a washing solution containing hydrogen peroxide is employed, as in the above-cited Patent References 2 through 4, to do the washing, Si cannot be adequately cleared away. Consequently, with Si as an impurity being the cause, the electrical characteristics will be harmed.

An explanation will now be made of a comparative example in which, instead of as in Steps S5 and S6, the wash is performed with phosphoric acid. Since phosphoric acid is a weaker acid than sulfuric acid and more weakly acidic than sulfuric acid/hydrogen peroxide, its etching of organic films and oxide films is inadequate. Washing the substrate with phosphoric acid therefore leaves it in a state in which, as indicated in FIG. 3, the organic film and oxide film 12 are left behind. Consequently, with the organic film and oxide film being the cause, the PL characteristics are harmed.

In accordance with the foregoing, the fact that with an InP substrate manufactured according to a method in the present embodying mode of manufacturing an InP substrate 10, the organic film and oxide film 12 are reduced means that the concentration of C and the concentration of O that has formed bonds with atoms other than S can be reduced to or below 40 atomic percent, while the fact that the impurities are reduced means that the concentration of $SO_4^{2-}$ can be reduced to or below 0.6 ng/cm². Therefore, when an epitaxial layer(s) has been formed onto the InP substrate 10, deterioration of the PL characteristics may be kept under control and at the same time deterioration of the electrical characteristics can be kept under control.

Embodying Mode 2

Figure 8:
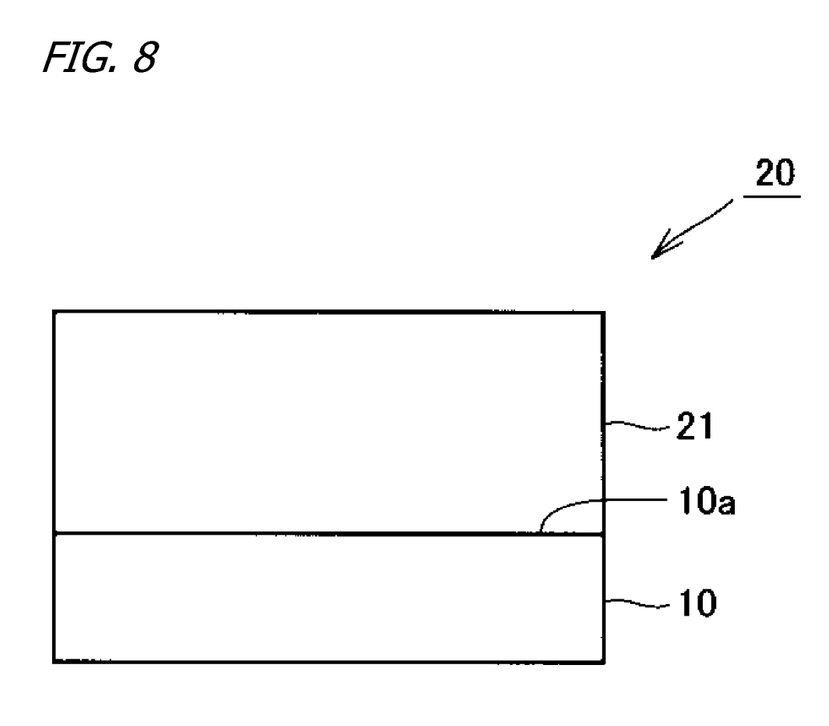
FIG. 8 is a side view representing, in simplified form, an epitaxial wafer in Embodying Mode 2 of the present invention.

Referring to FIG. 8, an explanation of an epitaxial wafer 20 in the present embodying mode will be made.

As represented in FIG. 8, the epitaxial wafer 20 comprises an InP substrate 10 of Embodying Mode 1, and an epitaxial layer 21 formed onto the front side 10a of the InP substrate 10.

The epitaxial layer 21 may be mono-laminar or multi-laminar.

Along the interface between the InP substrate 10 and the epitaxial layer 21, the Si concentration is not greater than $1.8 \times 10^{17}$ atoms/cm³ and the S concentration is not greater than $2 \times 10^{13}$ atoms/cm³, for example.

Figure 9:
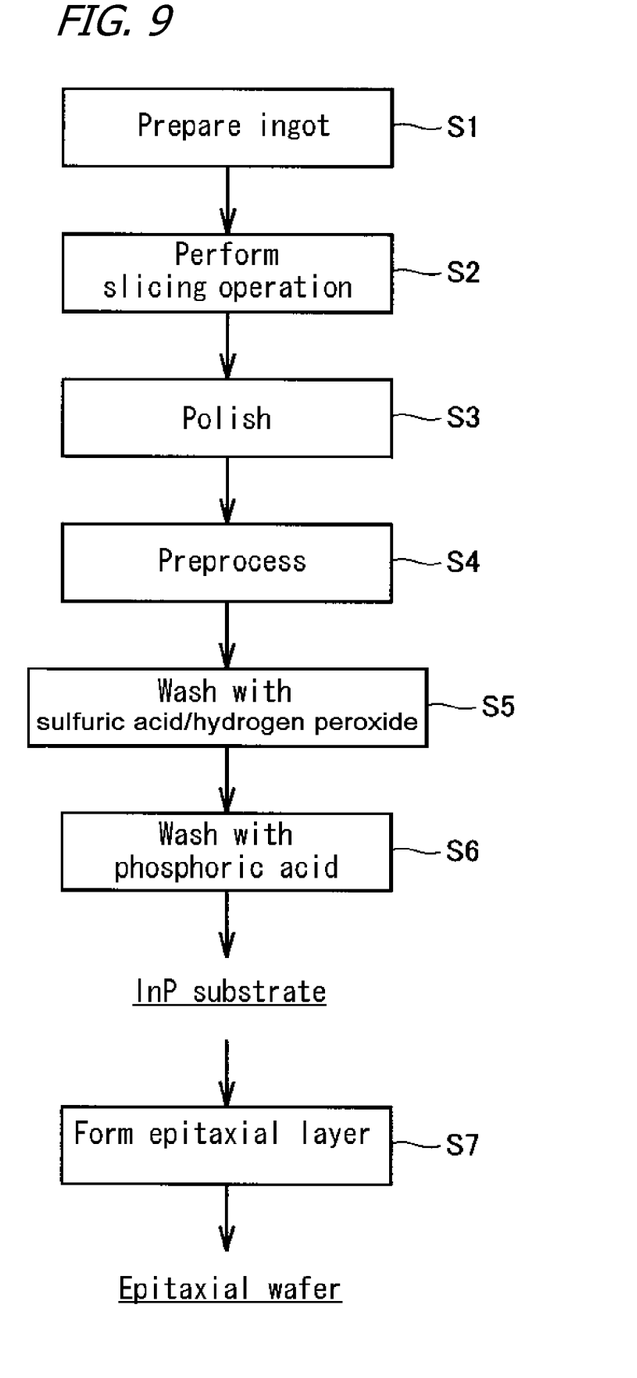
FIG. 9 is a flowchart setting forth a procedure for manufacturing an epitaxial wafer in Embodying Mode 2 of the present invention.

To continue: An explanation of a method in the present embodying mode of manufacturing an epitaxial wafer 20 will be made. To begin with, as indicated in FIG. 9, an InP substrate 10 is manufactured in conformity with Embodying Mode 1 (Steps S1 through S6).

Next an epitaxial layer 21 is formed atop the front side 10a of the InP substrate 10 (Step S7). The means whereby the epitaxial layer is formed is not particularly limited; vapor-phase growth methods such as OMVPE (organometallic vapor-phase epitaxy), HVPE (hydride vapor-phase epitaxy), MBE (molecular beam epitaxy) and sublimation deposition, as well as liquid-phase growth methods such as flux growth and high nitrogen-pressure solution growth can be adopted.

It should be understood that in Step S7, a plurality of circuit elements may be created. In that case, after an epitaxial layer 21 of a predetermined structure has been formed onto the front side 10a of the InP substrate 10, in order to singulate the InP substrate 10 into individual circuit elements, a dividing operation in which, for example, dicing and associated steps are carried out is implemented on the substrate.

Implementing the forgoing procedures (Steps S1 through S7) makes it possible to manufacture the epitaxial wafer 20 represented in FIG. 8.

An epitaxial wafer 20 manufactured in this way is for example mounted onto a leadframe or the like. Then, by implementing a wire-bonding or like procedure on the package, a semiconductor device utilizing the aforedescribed circuit element can be obtained.

A method in the present embodying mode of manufacturing an epitaxial wafer 20 utilizes an InP substrate 10 of Embodying Mode 1, in which the residue of the organic film and oxide film has been reduced, and the residue of impurities has been reduced. An epitaxial wafer 20 in which deterioration of the PL characteristics has been kept under control, and in which deterioration of the electrical characteristics has been kept under control can therefore be manufactured.

In such an epitaxial wafer 20, if the InP substrate 10 contains a dopant consisting of at least one substance selected from the group composed of Fe, S, Sn and Zn, it will have the following effects.

If the dopant is Fe, its concentration will be, for example, from $1 \times 10^{16}$ atoms/cc to $1 \times 10^{17}$ atoms/cc, and the electrical characteristics will be semi-insulating. In that case, if the concentration of Si and S at the interface between the InP substrate 10 and the epitaxial layer 21 is high, abnormalities in the electrical characteristics (leakage) will occur. Nevertheless, because the present embodying mode makes for reduction of the Si and S concentration, the epitaxial wafer is ideally suited to utilization in such devices as HEMTs (high electron mobility transistors) and HBTs (heterojunction bipolar transistors).

If the dopant is S, its concentration will be, for example, from $0.5 \times 10^{18}$ atoms/cc to $8 \times 10^{18}$ atoms/cc, and the electrical characteristics will be n-type. In that case, if the concentration of O and C at the interface between the InP substrate 10 and the epitaxial layer 21 is high, abnormalities in the electrical characteristics and degradation of the optical emission intensity will occur. Nevertheless, because the present embodying mode makes for reduction of the O and C concentration, the epitaxial wafer is ideally suited to utilization in lasers and like devices. And in implementations in which haze may be reduced, the emission intensity furthermore can be improved.

If the dopant is Sn, its concentration will be, for example, from $1\times10^{18}$ atoms/cc to $6\times10^{18}$ atoms/cc, and the electrical characteristics will be n-type. In that case, if the concentration of O and C at the interface between the InP substrate 10 and the epitaxial layer 21 is high, abnormalities in the electrical characteristics and degradation of the optical emission intensity will occur. Nevertheless, because the present embodying mode makes for reduction of the O and C concentration, the epitaxial wafer is ideally suited to utilization in lasers and like devices. And in implementations in which haze may be reduced, the emission intensity furthermore can be improved.

If the dopant is Zn, its concentration will be, for example, from $3\times10^{18}$ atoms/cc to $8\times10^{18}$ atoms/cc, and the electrical characteristics will be p-type. In that case, if the concentration of Si and S at the interface between the InP substrate 10 and the epitaxial layer 21 is high, abnormalities in the electrical characteristics and degradation of the optical emission intensity will occur. Nevertheless, because the present embodying mode makes for reduction of the Si and S concentration, the epitaxial wafer is ideally suited to utilization in lasers and like devices. And in implementations in which haze may be reduced, the emission intensity furthermore can be improved.

Embodiment 1

In the present embodiment, the effects from the provision of a step of washing with sulfuric acid/hydrogen peroxide and a step of washing with phosphoric acid were investigated.

Present Invention Example 1

The method of Present Invention Example 1 of manufacturing an InP substrate was basically the same as that of Embodying Mode 1. Specifically, to begin with an InP crystal ingot was grown by the vertical Bridgman technique (Step S1). A slicing operation was then carried out on the ingot (Step S2). Next, polishing employing a polishing solution containing a polishing agent, an oxidizer, and a pH adjuster, and in which the pH was between 2 and 4, inclusive, was performed (Step S3). Colloidal silica having grain sizes in which the grain diameter was from 3 nm to 30 nm was employed as the polishing agent. Trichloroisocyanuric acid was employed as the oxidizer. Malic acid was employed as the pH adjuster. An InP substrate was thereby prepared.

Next a preprocess was carried out (Step S4). For the preprocess, washing in an alkaline solution, washing in a hydrofluoric acid, and washing in an alkaline solution were carried out, in that order.

Next, the InP substrate was washed in sulfuric acid/hydrogen peroxide (Step S5). The sulfuric acid/hydrogen peroxide was sulfuric acid:hydrogen peroxide:water=10:1:1. And the wash was carried out at room temperature. After that the substrate was rinsed in running water for 10 minutes.

Subsequently, the InP substrate was washed in phosphoric acid (Step S6). The concentration of the phosphoric acid was 30. Following that, the substrate was given a running-water rinse for 10 minutes and afterwards underwent centrifugal drying. Here, the drying may be evaporative desiccation by means of alcohol. An InP substrate 10 of Present Invention Example 1 was thereby manufactured.

Comparative Examples 1 through 8

The method of manufacturing the InP substrates of Comparative Examples 1 through 8 was basically the same as that of Present Invention Example 1, but in a replacement of Steps S5 and S6, the washing solutions entered in Table I below were used.

Measurement Method

The front-side composition of the InP substrates of Present Invention Example 1 and Comparative Examples 1 through 8 was characterized by XPS analysis. A PHI Quantum 2000 was employed as the device for the measurement. The analysis parameters were as follows. Monochromatic AlKα photons having an energy of 1486.6 eV were employed as the x-ray source. The photoelectron ejection angle was put at 30°. The analysis area was made 1400 μm×300 μm. For the charge referencing a correction with the C 1s line of the C—H binding energy being 284.8 eV was carried out. The results are set forth in Table I below.

In addition, from the front-side composition of the InP substrates, the ratio of In to P (In/P) was found. Those results are set forth in Table I below.

TABLE I

| | | Surface composition (atomic %) | | | | | | | Surface composition (ng/cm$^2$) SO$_4^{2-}$ | Surface atomic ratio In/P |
|---|---|---|---|---|---|---|---|---|---|---|
| | Wash solution | In | P | C | O | S | C + O − S × 4 | In oxides | | |
| Pres. Invent. Ex.1 | Sulfuric acid/hydrogen peroxide (10:1:1) → phosphoric acid (30%) | 34.8 | 28.3 | 16.8 | 20.2 | 0 | 37.0 | 1.03 | 0.05 | 1.23 |
| Comp. Ex. 1 | Sulfuric acid (96%) | 28.5 | 22.3 | 20.6 | 26.3 | 2.3 | 37.7 | 0.53 | 1.6 | 1.28 |
| Comp. Ex. 2 | Sulfuric acid/hydrogen peroxide (10:1:1) | 29.3 | 23.1 | 21.1 | 25.8 | 0.7 | 44.1 | 0.8 | 0.07 | 1.27 |
| Comp. Ex. 3 | Hydrochloric acid (5%) | 30.5 | 22.0 | 20.9 | 26.6 | 0 | 47.5 | 2.0 | 0.05 | 1.39 |
| Comp. Ex. 4 | Hydrofluoric acid (30%) | 30.3 | 22.8 | 24.4 | 22.7 | 0 | 47.1 | 1.75 | 0.05 | 1.33 |
| Comp. Ex. 5 | Hydrofluoric acid/hydrogen peroxide (10:1:1) | 29.5 | 22.4 | 25.5 | 22.6 | 0 | 48.1 | 1.5 | 0.07 | 1.32 |
| Comp. Ex. 6 | Nitric acid (30%) | 29.0 | 22.4 | 26.1 | 22.5 | 0 | 48.6 | 1.5 | 0.06 | 1.29 |
| Comp. Ex. 7 | Phosphoric acid (30%) | 32.7 | 25.4 | 18.5 | 23.4 | 0 | 41.9 | 0.87 | 0.05 | 1.29 |
| Comp. Ex. 8 | Sulfuric acid (96%) → phosphoric acid (30%) | 33.1 | 27.2 | 16.3 | 20.9 | 2.5 | 27.2 | 0.5 | 1.5 | 1.22 |

Measurement Results

As indicated in Table I, with the InP substrate of Present Invention Example 1, which was washed with sulfuric acid/hydrogen peroxide and thereafter was washed with phosphoric acid, the concentration of sulfuric acid ions, which constituted impurities, was not greater than 0.6 ng/cm$^2$, while the concentration of O having formed bonds with C, which constituted an organic film, and the concentration of C was not greater than 40 atomic percent. It was therefore understood that with the front side of the InP substrate of Present Invention Example 1, impurities had been reduced, and the organic film and oxide film had been reduced as well.

Further, because it had been washed with phosphoric acid, the InP substrate of Present Invention Example 1 had a stabilized surface in which the front-side atomic ratio (In/P) 1.28 or less. Moreover, with the InP substrate of Present Invention Example 1, the In oxides could be reduced to no more than 1.2%.

On the other hand, with Comparative Example 1, which had been washed with sulfuric acid, and Comparative Example 8, which had been washed with phosphoric acid upon having been washed with sulfuric acid, the concentration of $SO_4^{2-}$ exceeded 0.6 ng/cm². From these facts it was understood that S deriving from sulfuric acid had remained on the InP substrate to a considerable extent.

And in Comparative Example 2 through Comparative Example 7, in which acids weaker than sulfuric acid were employed, the concentration of C and the concentration of O having formed bonds with atoms other than S exceeded 40 atomic percent. From these facts it was understood that an organic film and oxide film had remained on the InP substrate to a considerable extent.

From the foregoing, it could be confirmed that providing, according to the present embodiment, the step of washing with sulfuric acid/hydrogen peroxide and the step of washing with phosphoric acid made possible being able to reduce the residue of organic film to the same level as in cases where sulfuric acid is employed, and further made possible reducing the residue of impurities.

Also, it was understood that by providing the step of washing with sulfuric acid/hydrogen peroxide and the step of washing with phosphoric acid, an InP substrate may be realized in which the concentration of $SO_4^{2-}$ was at or below 0.6 ng/cm², and the concentration of C and the concentration of O having formed bonds with atoms other than S was at or below 40 atomic percent.

It will be appreciated that in Present Invention Example 1, the concentration of $SO_4^{2-}$ in the InP substrate was 0.05 ng/cm², and the concentration of C and the concentration of O having formed bonds with atoms other than S was 37 atomic percent. The present inventors gained the insight, resulting from dedicated research efforts, that in respect of the $SO_4^{2-}$ concentration, a margin of error of some 0.55 ng/cm² arises, while in respect of the concentration of C and the concentration of O having formed bonds with C, a margin of error of some 3 atomic percent arises. Consequently, in the present invention, allowing for a factor of safety with respect to the figures obtained in Present Invention Example 1, the threshold for the $SO_4^{2-}$ concentration is put at not greater than 0.6 ng/cm², while the threshold for the concentration of C and the concentration of O having formed bonds with atoms other than S is put at not greater than 40 atomic percent.

Embodiment 2

In the present embodiment, the effects of creating an epitaxial layer utilizing an InP substrate with respect to which a step of washing with sulfuric acid/hydrogen peroxide and a step of washing with phosphoric acid have been provided were investigated.

The following epitaxial layers were formed onto the InP substrates of Present Invention Example 1 and of Comparative Examples 1 through 8. An InP layer having a thickness of 300 nm was formed by an OMVPE technique onto the InP substrates.

Onto the InP layer, an InGaAs layer having a thickness of 5 nm was formed by an OMVPE technique. Onto the InGaAs layer, an InP layer having a thickness of 300 nm was formed by an OMVPE technique. Epitaxial wafers of Present Invention Example 1 and Comparative Examples 1 through 8 were thereby manufactured.

Measurement Method

In respect of the epitaxial wafers of Present Invention Example 1 and Comparative Examples 1 through 8, the PL intensity of the InGaAs layer was measured by a PL intensity measurement method with the following parameters. The excitation beam wavelength was 532 nm. The measurement wavelength was from 1250 nm to 1500 nm. For the measuring machine, a PLM 150 manufactured by Nanometrics Inc. was employed. The results are set forth in Table II below.

With further regard to the epitaxial wafers of Present Invention Example 1 and Comparative Examples 1 through 8, the Si concentration and S concentration at the interface between the epitaxial layers and the InP substrate were measured by SIMS. Those results are set forth in Table II below. Here, in Table II, "ND" indicates that because the concentration was below the detection bottom limit ($2\times10^{13}$ atoms/cm³), it was not detected.

TABLE II

|  | Wash solution | PL intensity (a.u.) | Si(atomic/cm³) | S(atomic/cm³) |
|---|---|---|---|---|
| Pres. Invent. Ex. 1 | Sulfuric acid/hydrogen peroxide(10:1:1) → phosphoric acid (30%) | 81.8 | $1.80 \times 10^{17}$ | ND |
| Comp. Ex. 1 | Sulfuric acid (96%) | 77.4 | $1.61 \times 10^{17}$ | $8.16 \times 10^{16}$ |
| Comp. Ex. 2 | Sulfuric acid/hydrogen peroxide(10:1:1) | 75.0 | $7.54 \times 10^{17}$ | ND |
| Comp. Ex. 3 | Hydrochloric acid (5%) | 56.0 | $7.38 \times 10^{17}$ | ND |
| Comp. Ex. 4 | Hydrofluoric acid (30%) | 59.0 | $6.22 \times 10^{17}$ | ND |
| Comp. Ex. 5 | Hydrofluoric acid/hydrogen peroxide (10:1:1) | 60.0 | $8.46 \times 10^{17}$ | ND |
| Comp. Ex. 6 | Nitric acid (30%) | 61.0 | $9.28 \times 10^{17}$ | ND |
| Comp. Ex. 7 | Phosphoric acid (30%) | 63.2 | $1.91 \times 10^{17}$ | ND |
| Comp. Ex. 8 | Sulfuric acid (96%) → phosphoric acid (30%) | 83.4 | $1.74 \times 10^{17}$ | $9.41 \times 10^{15}$ |

Measurement Results

As indicated in Table II, with the epitaxial wafer of Present Invention Example 1, furnished with an InP substrate that had been washed with sulfuric acid/hydrogen peroxide and thereafter had been washed with phosphoric acid, with the PL intensity being at least 80 (a.u.), the Pl characteristics could be kept from deteriorating. Moreover, the epitaxial wafer of Present Invention Example 1 had a low Si concentration of not greater than $2\times10^{17}$ atoms/cm³, and a low S concentration that was below the detection bottom limit. From these facts it was understood that the impurity concentration at the interface between the InP substrate and the epitaxial layers could be reduced. And it was understood that therefore the electrical characteristics could be kept from deteriorating.

On the other hand, in Comparative Example 1, in which an InP substrate that had been washed with sulfuric acid was employed, and in Comparative Example 8, in which an InP substrate that had been washed with phosphoric acid upon having been washed with sulfuric acid was employed, strongly acidic sulfuric acid was used. Inasmuch the organic film and oxide film could therefore be reduced, deterioration of the PL intensity could be kept under control, and the concentration of Si as an impurity could be reduced. It was understood, however, that in the interface between the InP substrate and the epitaxial layers, S deriving from the sulfuric acid remained to a considerable extent. It was understood that owing to these factors, deterioration of the electrical characteristics arose.

And in Comparative Example 2 through Comparative Example 7, employing InP substrates in which acids of weaker acidity than sulfuric acid were used, since sulfuric acid was not employed, the S concentration could be reduced. Yet since the organic film and oxide film could not be adequately reduced, the PL intensity was low. Further, it was understood that at the interface between the InP substrate and the epitaxial layer Si as an impurity remained to a considerable extent. It was understood that deterioration of the electrical characteristics arose from these factors.

Furthermore, when Comparative Example 1, which had been washed with sulfuric acid, and Comparative Example 2, which had been washed with a washing solution containing sulfuric acid and hydrogen peroxide, were compared, it was understood that on account of the solution's containing hydrogen peroxide, Si present at the interface could not be adequately cleared away. With Present Invention Example 1, while sulfuric acid/hydrogen peroxide was utilized, the Si that could not be sufficiently reduced with the sulfuric acid/hydrogen peroxide was further reduced with phosphoric acid, whereby the Si concentration could be reduced down to the same level as with sulfuric acid.

From the foregoing, it could be confirmed that by providing, according to the present embodiment, the step of washing with sulfuric acid/hydrogen peroxide and the step of washing with phosphoric acid, deterioration of the PL intensity could be minimized to the same level as in cases where sulfuric acid is employed, and furthermore, it was possible to kept the electrical characteristics from deteriorating.

Embodiment 3

In the present embodiment, the effects of washing with phosphoric acid of concentration that is between 1 and 30, inclusive, were investigated.

Present Invention Examples 2 through 5

The InP substrates and epitaxial wafers of Present Invention Examples 2 through 5 were manufactured in basically the same way as with Present Invention Example 1, but differed in that in Step S6 of washing with phosphoric acid, phosphoric acid of the concentrations entered in Table III below was utilized.

Measurement Method

The organic film thickness and the haze on the front side of the InP substrates, as well as the haze on the epitaxial layers, of Present Invention Examples 1 through 5 were measured. An Auto EL IV Ellipsometer, manufactured by Rudolph Research Analytical, was employed to measure the organic film thickness. A 6220 Surfscan Wafer Surface Inspection System, manufactured by KLA-Tencor Corporation was employed to measure the haze. These results are set forth in Table III below.

TABLE III

| | Phosphoric acid conc. (%) | Organic film thickness (Å) | InP substrate haze (ppm) | Epitaxial layer haze (ppm) |
|---|---|---|---|---|
| Pres. Invent. Ex. 2 | 1% | 5.20 | 1.26 | 1.35 |
| Pres. Invent. Ex. 3 | 5% | 4.94 | 1.15 | 1.23 |
| Pres. Invent. Ex. 1 | 30% | 4.60 | 1.22 | 1.67 |
| Pres. Invent. Ex. 4 | 50% | 2.67 | 1.95 | 2.40 |
| Pres. Invent. Ex. 5 | 85% | 5.00 | 1.93 | 2.39 |

Measurement Results

As indicated in Table III, with Present Invention Examples 1 through 3, in which the phosphoric acid concentration was from 1 to 30, haze in the InP substrates and haze in the epitaxial wafers was diminished. It was understood that because the front-side roughness of the InP substrates was minuscule, the morphology of the epitaxial wafers had ameliorated.

From the foregoing, it was understood that by washing, according to the present embodiment, with phosphoric acid of from 1 to 30 concentration, haze on the front side of InP substrates and epitaxial wafers may be reduced.

The presently disclosed embodying modes and embodiment examples should in all respects be considered to be illustrative and not limiting. The scope of the present invention is set forth not by the above-described embodying modes but by the scope of the patent claims, and is intended to include meanings equivalent to the scope of the patent claims and all modifications within the scope.

REFERENCE SIGNS LIST 10, 11: InP substrate; 10a, 11a: front side; 12: organic film and oxide film; 20: epitaxial wafer; 21: epitaxial layer

The invention claimed is:

1. An indium phosphide substrate manufactured according to an indium phosphide substrate manufacturing method comprising:
    a step of preparing an indium phosphide substrate;
    a step of washing the indium phosphide substrate with sulfuric acid/hydrogen peroxide; and
    a step, following said step of washing with sulfuric acid/hydrogen peroxide, of washing the indium phosphide substrate with phosphoric acid;
    the indium phosphide substrate having a front side, and characterized in that:
        along said front side, concentration of sulfuric-acid ions is not greater than 0.6 ng/cm$^2$, and concentration of carbon and concentration of oxygen that has formed bonds with atoms other than sulfur is 40 atomic percent or less.

2. The indium phosphide substrate set forth in claim 1, characterized in that along the front side the ratio of the In concentration to the P concentration (In/P) is 1.23 or less, and In oxides are 1.2 atomic percent or less.

3. The indium phosphide substrate set forth in claim 1, incorporating a dopant consisting of at least one substance selected from the group composed of iron, sulfur, tin, and zinc.

4. An epitaxial wafer comprising:
    the indium phosphide substrate set forth in claim 1; and an epitaxial layer formed onto the front side of said indium phosphide substrate.

* * * * *